United States Patent
Sannikov

(10) Patent No.: US 9,640,717 B2
(45) Date of Patent: May 2, 2017

(54) ULTRAVIOLET LIGHT EMITTING APPARATUS

(71) Applicant: Samsung Electronics Co., Ltd., Suwon-si, Gyeonggi-do (KR)

(72) Inventor: Denis Sannikov, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 63 days.

(21) Appl. No.: 14/814,732

(22) Filed: Jul. 31, 2015

(65) Prior Publication Data
US 2016/0126409 A1    May 5, 2016

(30) Foreign Application Priority Data

Nov. 3, 2014  (KR) .................. 10-2014-0151577

(51) Int. Cl.
| | | |
|---|---|---|
| H01L 33/06 | (2010.01) | |
| G09G 3/32 | (2016.01) | |
| H01L 33/32 | (2010.01) | |
| H01L 33/50 | (2010.01) | |

(52) U.S. Cl.
CPC .............. *H01L 33/06* (2013.01); *G09G 3/32* (2013.01); *G09G 2300/0426* (2013.01); *H01L 33/325* (2013.01); *H01L 33/50* (2013.01)

(58) Field of Classification Search
USPC ......................................... 250/504 R, 492.2
See application file for complete search history.

(56) References Cited

U.S. PATENT DOCUMENTS

| | | | |
|---|---|---|---|
| 5,679,965 A | * | 10/1997 | Schetzina ............. B82Y 20/00 257/103 |
| 6,372,608 B1 | | 4/2002 | Shimoda et al. |
| 6,645,830 B2 | | 11/2003 | Shimoda et al. |
| RE38,466 E | | 3/2004 | Inoue et al. |
| 6,818,465 B2 | | 11/2004 | Biwa et al. |
| 6,818,530 B2 | | 11/2004 | Shimoda et al. |
| 6,858,081 B2 | | 2/2005 | Biwa et al. |

(Continued)

FOREIGN PATENT DOCUMENTS

| | | |
|---|---|---|
| JP | 2012-522388 A | 9/2012 |
| JP | 2013-135035 A | 7/2013 |

(Continued)

*Primary Examiner* — Kiet T Nguyen
(74) *Attorney, Agent, or Firm* — Harness, Dickey & Pierce, P.L.C.

(57) ABSTRACT

An ultraviolet light emitting apparatus may include a chamber, at least one semiconductor light emitting device, an electron beam irradiation source, and first and second connection electrodes configured to apply a voltage from an external power source to the at least one semiconductor light emitting device. The chamber may define an internal space and include a light emission window. The at least one semiconductor light emitting device may be on the light emission window and include a first conductivity type nitride semiconductor layer, an undoped nitride semiconductor layer, and an active layer between the first conductivity type nitride semiconductor layer and the undoped nitride semiconductor layer. The electron beam irradiation source may be in the internal space of the chamber and configured to irradiate an electron beam onto the undoped nitride semiconductor layer.

20 Claims, 8 Drawing Sheets

(56) References Cited

U.S. PATENT DOCUMENTS

| | | | |
|---|---|---|---|
| 6,967,353 | B2 | 11/2005 | Suzuki et al. |
| 7,002,182 | B2 | 2/2006 | Okuyama et al. |
| 7,084,420 | B2 | 8/2006 | Kim et al. |
| 7,087,932 | B2 | 8/2006 | Okuyama et al. |
| 7,154,124 | B2 | 12/2006 | Han et al. |
| 7,208,725 | B2 | 4/2007 | Sherrer et al. |
| 7,288,758 | B2 | 10/2007 | Sherrer et al. |
| 7,319,044 | B2 | 1/2008 | Han et al. |
| 7,501,656 | B2 | 3/2009 | Han et al. |
| 7,709,857 | B2 | 5/2010 | Kim et al. |
| 7,759,140 | B2 | 7/2010 | Lee et al. |
| 7,781,727 | B2 | 8/2010 | Sherrer et al. |
| 7,790,482 | B2 | 9/2010 | Han et al. |
| 7,940,350 | B2 | 5/2011 | Jeong |
| 7,959,312 | B2 | 6/2011 | Yoo et al. |
| 7,964,881 | B2 | 6/2011 | Choi et al. |
| 7,985,976 | B2 | 7/2011 | Choi et al. |
| 7,994,525 | B2 | 8/2011 | Lee et al. |
| 8,008,683 | B2 | 8/2011 | Choi et al. |
| 8,013,352 | B2 | 9/2011 | Lee et al. |
| 8,049,161 | B2 | 11/2011 | Sherrer et al. |
| 8,129,711 | B2 | 3/2012 | Kang et al. |
| 8,179,938 | B2 | 5/2012 | Kim |
| 8,263,987 | B2 | 9/2012 | Choi et al. |
| 8,324,646 | B2 | 12/2012 | Lee et al. |
| 8,399,944 | B2 | 3/2013 | Kwak et al. |
| 8,432,511 | B2 | 4/2013 | Jeong |
| 8,435,879 | B2 * | 5/2013 | Hanser .................... C30B 25/02 257/E21.097 |
| 8,459,832 | B2 | 6/2013 | Kim |
| 8,502,242 | B2 | 8/2013 | Kim |
| 8,536,604 | B2 | 9/2013 | Kwak et al. |
| 8,564,014 | B2 | 10/2013 | Sampath et al. |
| 8,652,958 | B2 | 2/2014 | Khan |
| 8,698,123 | B2 | 4/2014 | Shioda et al. |
| 8,723,189 | B1 | 5/2014 | Liao et al. |
| 8,735,931 | B2 | 5/2014 | Han et al. |
| 8,759,813 | B2 | 6/2014 | Hirayama |
| 8,766,295 | B2 | 7/2014 | Kim |
| 2010/0314605 | A1 | 12/2010 | Khan |
| 2010/0320440 | A1 | 12/2010 | Khan |
| 2012/0018753 | A1 | 1/2012 | Hao et al. |
| 2012/0034718 | A1 | 2/2012 | Khan |
| 2012/0161104 | A1 | 6/2012 | Okamoto et al. |
| 2013/0075697 | A1 | 3/2013 | Kawakami et al. |
| 2013/0277642 | A1 | 10/2013 | Kneissl et al. |

FOREIGN PATENT DOCUMENTS

| | | |
|---|---|---|
| JP | 2013-207146 A | 10/2013 |
| KR | 20110109438 A | 10/2011 |
| KR | 10-1090900 | 12/2011 |
| KR | 10-1288673 B1 | 7/2013 |
| WO | WO-2011/024615 A1 | 3/2011 |

* cited by examiner

ULTRAVIOLET LIGHT EMITTING APPARATUS

CROSS-REFERENCE TO RELATED APPLICATION

This application claims priority under 35 U.S.C. §119 to Korean Patent Application No. 10-2014-0151577, filed on Nov. 3, 2014 in the Korean Intellectual Property Office, the entire disclosure of which is incorporated herein by reference.

BACKGROUND

The present disclosure relates to an ultraviolet light emitting apparatus.

Ultraviolet light sources have been employed for various purposes in apparatuses such as sterilizers, disinfection devices, UV curing apparatuses and the like. As ultraviolet light sources, environmentally friendly semiconductor light emitting diodes (LED) having high efficiency characteristics have received considerable attention. For example, nitride semiconductor light emitting diodes have been used.

However, in the case of UV nitride semiconductor LEDs, the external quantum efficiency thereof may be degraded because of Auger recombination due to crystal defects and a low carrier concentration (particularly, in the case of holes). For example, in the case of nitride semiconductor LEDs for a short-wavelength region (for example, UVB and UVC) in an ultraviolet band, since external quantum efficiency may be merely 2% to 3%, the commercialization of nitride semiconductor LEDs may be limited.

SUMMARY

Example embodiments relate to an ultraviolet light emitting apparatus having improved external quantum efficiency by increasing a concentration of carriers in a semiconductor light emitting device.

According to example embodiments of inventive concepts, an ultraviolet light emitting apparatus may include a chamber, a semiconductor light emitting device, an electron beam irradiation source, and first and second electrodes. The chamber may include alight emission window. The chamber may define an internal space. The semiconductor light emitting device may be on the light emission window. The semiconductor light emitting device may include a first conductivity type nitride semiconductor layer, an undoped nitride semiconductor layer, and an active layer between the first conductivity type nitride semiconductor layer and the undoped nitride semiconductor layer. The electron beam irradiation source may be in the internal space of the chamber and configured to irradiate an electron beam onto the undoped nitride semiconductor layer. The first and second connection electrodes may be configured to apply a voltage from an external power source to the semiconductor light emitting device.

In example embodiments, the active layer may have a single quantum well layer including $Al_xGa_{1-x}N(0<x<1)$.

In example embodiments, the active layer may have a plurality of quantum well layers including $Al_{x1}Ga_{1-x1}N$ $(0<x1<1)$ and a plurality of quantum barrier layers including $Al_{x2}Ga_{1-x2}N$ $(x1<x2<1)$. The plurality of quantum well layers and the plurality of quantum barrier layers may be alternately stacked on each other.

In example embodiments, the active layer may be configured to emit light having a wavelength of 210 to 315 nm.

In example embodiments, the active layer may be doped with a first conductivity type impurity.

In example embodiments, the undoped nitride semiconductor layer may include $Al_xIn_yGa_{(1-x-y)}N(0<x\leq1, 0\leq y<1)$.

In example embodiments, the first conductivity type nitride semiconductor layer may face the light emission window.

In example embodiments, the first conductivity type nitride semiconductor layer may include an n-type nitride semiconductor layer that includes $Al_xIn_yGa_{(1-x-y)}N(0<x\leq1, 0\leq y<1)$.

In example embodiments, the undoped nitride semiconductor layer may have a thickness of 50 nm to 1 μm.

In example embodiments, the semiconductor light emitting device may further include a first electrode connected to the first conductivity type nitride semiconductor layer and a second electrode on the undoped nitride semiconductor layer.

In example embodiments, the second electrode may have a thickness of 20 nm to 100 nm. The second electrode may include a bonding electrode on a region of an upper surface of the undoped nitride semiconductor layer. The second electrode may include at least one finger electrode extended from the bonding electrode.

In example embodiments, the ultraviolet light emitting apparatus may include a plurality of semiconductor light emitting devices electrically connected to each other. The plurality of semiconductor light emitting devices may include the semiconductor light emitting device.

In example embodiments, the electron beam irradiation source may be configured to emit an electron beam of 5 to 50 KV.

According to example embodiments of inventive concepts, an ultraviolet light emitting apparatus may include a chamber, a semiconductor light emitting device on a light emission window including in the chamber, an electron beam irradiation source, first and second connection electrodes connected to the semiconductor light emitting device and drawn outwardly from the chamber, a first driving unit configured to drive the electron beam irradiation source, a second driving unit configured to drive the semiconductor light emitting device through the first and second connection electrodes, and a driving controller configured to control the first and second driving units. The semiconductor light emitting device may include a first conductivity type semiconductor layer, a capping layer including at least one of an undoped semiconductor and a second conductivity type semiconductor, and an active layer between the first conductivity type semiconductor layer and the capping layer. The electron beam irradiation source may be in the internal space of the chamber and may be configured to irradiate an electron beam onto the capping layer.

In example embodiments, the capping layer may be an undoped semiconductor layer, and the first conductivity type semiconductor layer may be an n-type semiconductor layer.

In example embodiments, the active layer may be configured to emit light having an ultraviolet band wavelength.

In example embodiments, the semiconductor light emitting device may further include a light transmissive substrate, and the first conductivity type semiconductor layer may be on the light transmissive substrate.

In example embodiments, the semiconductor light emitting device may be between the light transmissive substrate and the first conductivity type semiconductor layer and may further include a buffer layer including $Al_xGa_{1-x}N$ $(0<x\leq1)$.

According to example embodiments of inventive concepts, an ultraviolet light emitting apparatus may include a chamber (e.g., vacuum chamber), a semiconductor light emitting device, an electron beam irradiation source, and first and second connection electrodes connected to the semiconductor light emitting device and configured to apply a driving voltage thereto and drawn outwardly from the vacuum chamber. The chamber may define an internal space and including a light emission window. The semiconductor light emitting device may be on the light emission window. The semiconductor light emitting device may include an n-type nitride semiconductor layer, a capping layer including an undoped nitride semiconductor, and an active layer between the n-type nitride semiconductor layer and the capping layer. The semiconductor light emitting device may be configured to emit light having an ultraviolet band wavelength. The electron beam irradiation source may be in the internal space of the vacuum chamber and configured to irradiate an electron beam onto the capping layer.

According to example embodiments of inventive concepts, a light emitting apparatus may include a semiconductor light emitting device including a plurality of nitride semiconductor layers, an electron beam irradiation source, and first and second electrodes configured to apply a voltage to the semiconductor light emitting device. The plurality of nitride semiconductor layers may include a capping layer contacting an active layer. The capping layer may include at least one of p-type nitride semiconductor layer and an undoped nitride semiconductor layer. The electron beam irradiation source may be configured to irradiate an electron beam onto the capping layer. The active layer may be configured to emit light in response to the voltage applied to the semiconductor light emitting device by the first and second electrodes.

In example embodiments, the light emitting apparatus may further include a first driving unit configured to drive the electron beam irradiation source, a second driving unit configured to drive the semiconductor light emitting device through the first and second electrodes, and a driving controller configured to control the first and second driving units.

In example embodiments, the plurality of nitride semiconductor layers may include an n-type nitride semiconductor layer. The active layer may be between the n-type nitride semiconductor layer and the capping layer. The active layer may include at least one quantum well layer including AlGaN. The capping layer may include $Al_xIn_yGa_{(1-x-y)}N$ ($0<x\leq1$, $0\leq y<1$). The n-type nitride semiconductor layer may include $Al_xIn_yGa_{(1-x-y)}N$ ($0<x\leq1$, $0\leq y<1$).

In example embodiments, the light emitting apparatus may further include a chamber including a light emission window. The chamber may define an internal space. The semiconductor light emitting device may be in the chamber. The semiconductor light emitting device may face the light emission window.

In example embodiments, the light emitting apparatus may further include a plurality of semiconductor light emitting devices electrically connected to each other. The plurality of semiconductor light emitting devices may include the semiconductor light emitting device.

BRIEF DESCRIPTION OF DRAWINGS

The foregoing and other features of inventive concepts will be apparent from the more particular description of non-limiting embodiments of inventive concepts, as illustrated in the accompanying drawings in which like reference characters refer to like parts throughout the different views.

The drawings are not necessarily to scale, emphasis instead being placed upon illustrating principles of inventive concepts. In the drawings.

DETAILED DESCRIPTION

Figure 1:
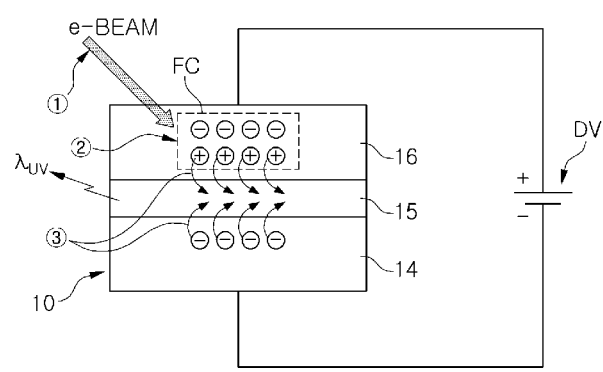
FIG. 1 is a schematic diagram illustrating a driving principle of an ultraviolet light emitting apparatus according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., semiconductor light emitting device) is illustrated in a cross-sectional view, an electronic device may include a plurality of the device structures (e.g., semiconductor light emitting devices), as would be illustrated by a plan view of the electronic device. The plurality of device structures may be arranged in an array and/or in a two-dimensional pattern.

Unless explicitly described otherwise, in the specification, the terms 'on', 'upper surface', 'under', 'lower surface', 'upward', 'downward', 'side surface', 'high', 'low' and the like are used based on the drawings, and may actually be different depending on a direction in which a light emitting device is disposed.

FIG. 1 is a schematic diagram illustrating a driving principle of an ultraviolet light emitting apparatus according to example embodiments of inventive concepts.

Referring to FIG. 1, a semiconductor light emitting device 10 may include a first conductivity type semiconductor layer 14, a capping layer 16, and an active layer 15 interposed between the first conductivity type semiconductor layer 14 and the capping layer 16.

The first conductivity type semiconductor layer 14 may be an n-type nitride semiconductor layer satisfying $Al_xIn_yGa_{1-x-y}N$ ($0<x\leq1$, $0\leq y<1$), and an n-type impurity may be silicon (Si). For example, the first conductivity type semiconductor layer 14 may contain n-type AlGaN. The capping layer 16, a pseudo p-type semiconductor layer, may be an undoped or p-type nitride semiconductor layer satisfying $Al_xIn_yGa_{1-x-y}N$ ($0<x\leq1$, $0\leq y<1$). A p-type impurity may be Mg. It may be unnecessary to be doped with the p-type impurity at a high concentration, and an undoped nitride semiconductor layer can be used. For example, the capping layer 16 may include undoped AlGaN.

The active layer 15 may have a single quantum well (SQW) structure having a single quantum well formed of $Al_xGa_{1-x}N(0<x<1)$. Alternatively, the active layer 15 may have a multiple quantum well (MQW) structure in which a plurality of quantum well layers formed of $Al_{x1}Ga_{1-x1}N$ ($0<x1<1$) and a plurality of quantum barrier layers formed of $Al_{x2}Ga_{1-x2}N$ ($x1<x2<1$) are alternately stacked.

The semiconductor light emitting device 10 for emitting ultraviolet light may be a semiconductor having a wide bandgap by increasing a compositional ratio of Al. In the semiconductor having a wide bandgap as described above, even in the case that a p-type impurity is doped at a high concentration, the p-type impurity may be positioned at an acceptor level having a significant difference (for example, 200 meV to 1000 meV) from a conduction band, thereby leading to difficulties in the activation of the p-type impurity. Due to a low carrier concentration, injection efficiency may be low and consequently, external quantum efficiency may be degraded.

However, in example embodiments, ①an electron beam may be irradiated onto the capping layer 16 positioned to be opposed to the first conductivity type semiconductor layer 14 to ② generate a great quantity of free carriers (FC) and a voltage may be applied to the semiconductor light emitting device 10 in a state in which a number of free carriers are generated to ③ inject carriers to the active layer 15 having the quantum well, thereby emitting UV light.

As described above, although the capping layer 16 is doped with a p-type impurity at a low concentration or is an intentionally undoped semiconductor layer, it may generate a large number of free carriers (FC) by an electron beam. When a voltage is applied to the semiconductor light emitting device 10 using a driving power source (DV) connected to the first conductivity type semiconductor layer 14 and the capping layer 16, holes in free carriers generated from the capping layer 16 and electrons in the first conductivity type semiconductor layer 14 may drift to the quantum well of the active layer 15 to thereby result in an increase in injection efficiency. The quantum well of the active layer 15 may be formed of a material having a wide band gap such as AlGaN, thereby emitting desired UV light λuv.

Figure 2:
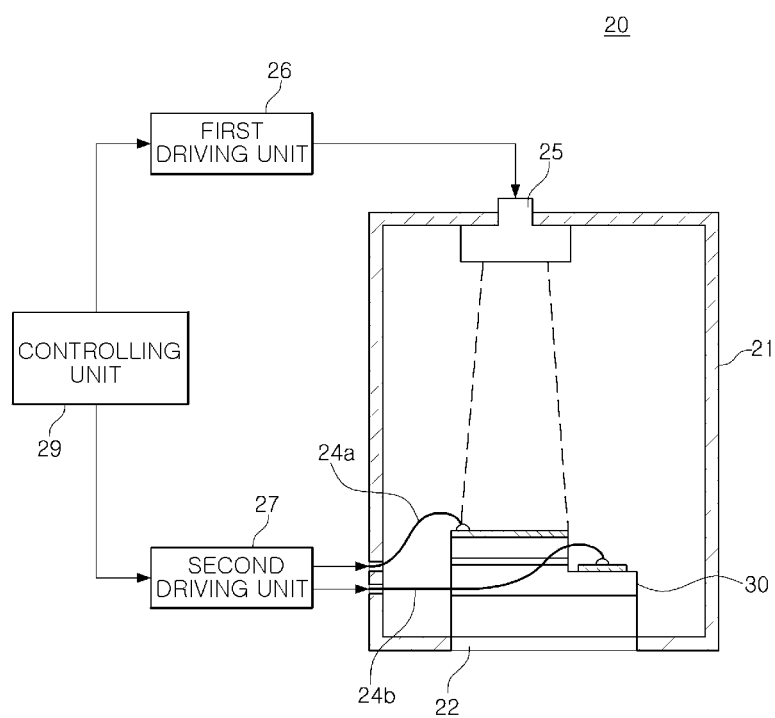
FIG. 2 is a schematic diagram illustrating an ultraviolet light emitting apparatus according to example embodiments of inventive concepts.
Figure 3:
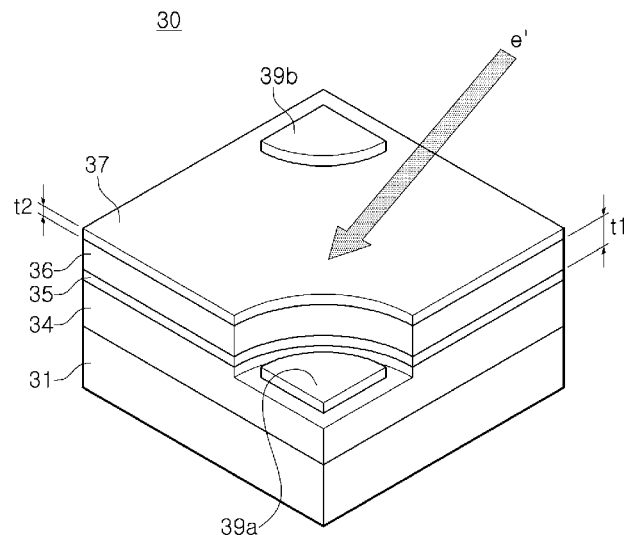
FIG. 3 is a schematic perspective view illustrating a semiconductor light emitting diode employed in FIG. 2.

FIG. 2 is a schematic diagram illustrating an ultraviolet light emitting apparatus according to example embodiments of inventive concepts. FIG. 3 is a schematic perspective view illustrating a semiconductor light emitting diode employed in FIG. 2.

An ultraviolet light emitting apparatus 20 illustrated in FIG. 2 may include a chamber 21 having an internal space and an electron beam irradiation source 25 mounted in the internal space of the chamber 21.

The chamber 21 may include a light emission window 22 and a semiconductor light emitting device 30 for emitting ultraviolet light may be disposed on the light emission window 22. The chamber 21 may be configured such that the internal space thereof may be in a vacuum state.

As illustrated in FIG. 3, the semiconductor light emitting device 30 may include a first conductivity type nitride semiconductor layer 34, an undoped nitride semiconductor layer 36, and an active layer 35 interposed between the first conductivity type nitride semiconductor layer 34 and the undoped nitride semiconductor layer 36. The active layer 35 may be doped with a first conductivity type impurity. In example embodiments, portions of the undoped nitride semiconductor layer 36 and the active layer 35 may be etched to expose an electrode formation region of the first conductivity type nitride semiconductor layer 34. A contact electrode 37 may be disposed on the undoped nitride semiconductor layer 36, and first and second electrodes 39a and 39b may be disposed on the electrode formation region of the first conductivity type nitride semiconductor layer 34 and a portion of the contact electrode 37. The semiconductor light emitting device 30 may further include a light transmissive substrate 31, and the first conductivity type nitride semiconductor layer 34 may be disposed on the light transmissive substrate 31.

In the semiconductor light emitting device 30, the first conductivity type nitride semiconductor layer 34 may be disposed toward the light emission window 22. For example, the semiconductor light emitting device 30 may be adhered to the light emission window 22 using a UV curable resin. In example embodiments, the light transmissive substrate 31 may contact the light emission window 22. The light emission window 22 may be a UV-transmissive window formed of a UV-transmissive material.

The electron beam irradiation source 25 may be disposed such that an electron beam is irradiated onto the undoped nitride semiconductor layer 36. As illustrated in FIG. 2, the semiconductor light emitting device 30 may be disposed such that the undoped nitride semiconductor layer 36 is positioned toward the electron beam irradiation source 25.

The ultraviolet light emitting apparatus 20 may further include a first driving unit 26 for applying a voltage to the electron beam irradiation source 25 and a second driving unit 27 for applying a voltage to the semiconductor light emitting device 30. The ultraviolet light emitting apparatus 20 may further include first and second connection electrodes 24a and 24b configured to apply external power of the second driving unit 27 to the semiconductor light emitting device 30. The first and second connection electrodes 24a and 24b may be connected to the semiconductor light emitting device 30 and may be drawn outwardly from the chamber 21. As illustrated in FIG. 2, the first and second connection electrodes 24a and 24b may have one ends connected to the first and second electrodes 39a and 39b, respectively, and the other ends connected to the second driving unit 27.

The first and second driving units 26 and 27 may be controlled by a controlling unit 29 and may apply a driving voltage to the electron beam irradiation source 25 and the semiconductor light emitting device 30.

Figure 4:
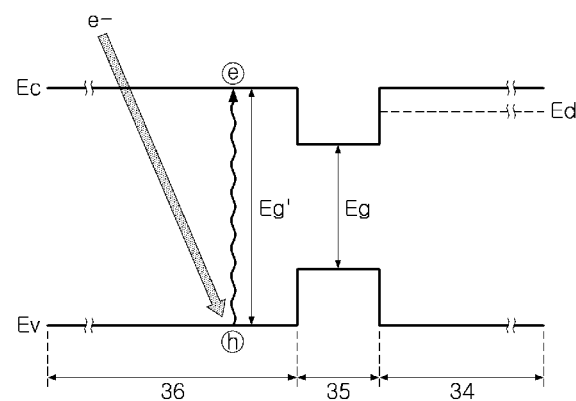
FIG. 4 is a band diagram illustrating a driving principle of the semiconductor light emitting diode.

FIG. 4 is a band diagram illustrating a driving principle of a semiconductor light emitting device in the ultraviolet light emitting apparatus.

Referring to FIG. 4, a band diagram of the first conductivity type nitride semiconductor layer 34, the undoped nitride semiconductor layer 36 and the active layer 35 is illustrated. The first conductivity type nitride semiconductor layer 34 may be n-type AlGaN. The first conductivity type nitride semiconductor layer 34 may have a donor level Ed due to the doping of an n-type impurity. The undoped nitride semiconductor layer 36 may be undoped AlGaN. The undoped AlGaN 36 may act as a pseudo-p type AlGaN. The active layer 35 employed in example embodiments may be a single quantum well structure formed of AlGaN. An AlGaN quantum well of the active layer 35 may have a band gap Eg for desired ultraviolet light. The AlGaN quantum well of the active layer 35 may be formed to emit light having a wavelength of 210 to 315 nm. The first conductivity type nitride semiconductor layer 34 formed of n-type AlGaN and the undoped nitride semiconductor layer 36 formed of AlGaN may have a band gap Eg' greater than the band gap Eg of the quantum well.

When an electron beam is irradiated on the undoped AlGaN 36, free carriers may be generated. For example, approximately 250 pairs of electrons and holes may be generated by a single electron. Using such an electron beam (e−), free carriers (e.g., electrons ⓔ and holes ⓗ) may be generated. In the generated free carriers ⓔ and ⓗ, only the holes ⓗ may be selected by voltage applied by the second driving unit 27 to be injected into the active layer and may be recombined with electrons injected from the n-type AlGaN 34 on the opposite side thereof.

Figure 5:
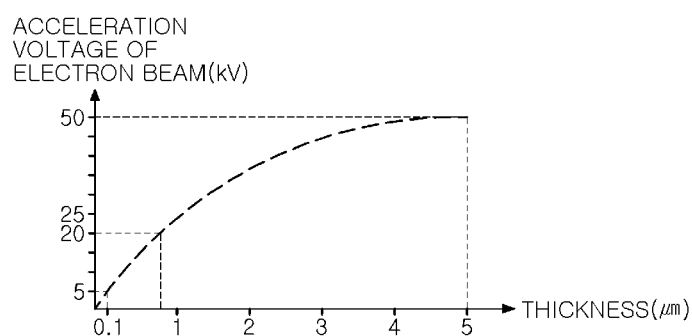
FIG. 5 is a graph illustrating a penetration thickness of a subject to be irradiated depending on an acceleration voltage of an electron beam.

The electron beam may penetrate into the interior of the undoped nitride semiconductor layer 36 to generate electrons and holes. The electron beam irradiation source 25 may emit an electron beam of 5 to 50 KV, but is not limited thereto. An acceleration voltage of the electron beam may determine a degree of thickness to which the electron beam penetrates. A thickness t1 of the undoped nitride semiconductor layer 36 may be 20 nm to 1 μm, but is not limited thereto. For example, the thickness t1 of the undoped nitride semiconductor layer 36 may be 20 nm to 800 nm. As can be confirmed in FIG. 5, in the case that the undoped nitride semiconductor layer 36 has the thickness as described above, a sufficient concentration of a plurality of carriers may be generated even with the use of an electron beam having an acceleration voltage of 20 KV or less (e.g., greater than 0 KV and less than or equal to 20 KV).

In example embodiments, in the case that the contact electrode 37 is disposed on the undoped nitride semiconductor layer 36, a thickness t2 of the contact electrode 37 may be 100 nm or less (e.g., greater than 0 nm and less than or equal to 100 nm) so as to allow the electron beam to sufficiently reach the undoped nitride semiconductor layer 36. The contact electrode 37 may have an appropriate thickness so as to perform an electrode function. For example, the thickness t2 of the contact electrode 37 may be 20 nm or more (e.g., greater than or equal to 20 nm and less than or equal to 100 nm). In example embodiments, a finger electrode may be used to allow the electron beam to be directly irradiated onto the undoped nitride semiconductor layer 36 (see FIG. 10).

Figure 6:
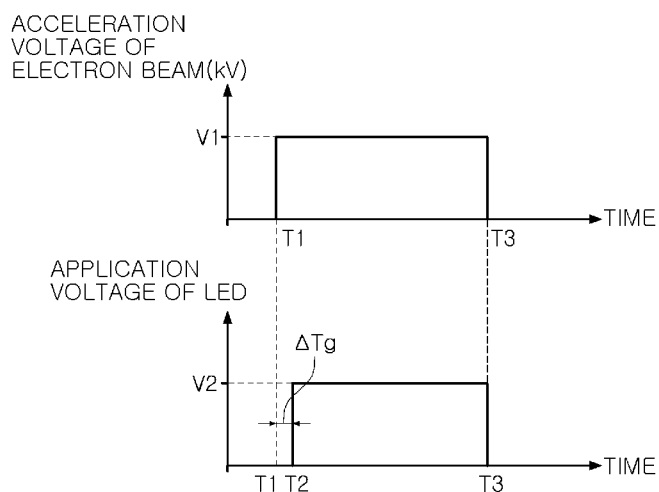
FIG. 6 is an example of time charts illustrating levels of voltage applied to an electron beam irradiation source and a semiconductor light emitting diode for driving an ultraviolet light emitting apparatus.

FIG. 6 is an example of time charts illustrating levels of voltage applied to an electron beam irradiation source and a semiconductor light emitting diode for driving an ultraviolet light emitting apparatus.

Figure 7:
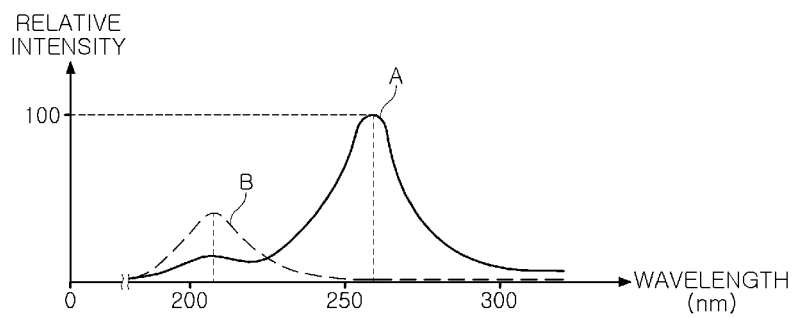
FIG. 7 illustrates a spectrum of light emitted from the ultraviolet light emitting apparatus according to example embodiments of inventive concepts.

FIG. 7 illustrates a spectrum of light emitted from the ultraviolet light emitting apparatus according to example embodiments of inventive concepts. The time charts illustrated in FIG. 6 may be understood as a process controlled by the controlling unit 29. In example embodiments, the controlling unit 29 may be a hardware processor such as central processing unit (CPU), a multi-processor, a distributed processing system, an application specific integrated circuit (ASIC), and/or a suitable hardware processing unit.

Referring to FIG. 6, the first driving unit 26 may apply a voltage V1 to the electron beam irradiation source 25 at a time T1 to irradiate an electron beam to the undoped nitride semiconductor layer. After a desired (and/or alternatively predetermined) time ΔTg has elapsed (at a time T2), the second driving unit 27 may apply a voltage V2 to the semiconductor light emitting device 30. During the desired (and/or alternatively predetermined) time ΔTg, a sufficient amount of free carriers can be generated. The semiconductor light emitting device 30 may be driven at the time T1 identical to a time at which the electron beam irradiation source 25 starts to be driven. In example embodiments, in order to secure time for which a sufficient amount of carriers may be generated by the irradiation of the electron beam, the semiconductor light emitting device 30 may be driven after the desired (and/or alternatively predetermined) time ΔTg has elapsed, subsequently to the irradiation of the electron beam.

A desired emission of ultraviolet light may be obtained in during a time from T2 to T3. Specifically, holes in free carriers generated from the undoped AlGaN 36 by the electron beam may be injected into the quantum well of the active layer 35 and may be recombined with electrons injected from the n-type AlGaN 34 opposed to the undoped AlGaN 36, whereby ultraviolet light having a desired wavelength may be emitted. For example, in a quantum well of $Al_{0.65}Ga_{0.35}N$, a light emission spectrum A having a peak wavelength of approximately 260 nm is illustrated as in FIG. 7.

After a time T3 or when only an electron beam is irradiated but a voltage of the semiconductor light emitting device is not applied, a drift of carriers due to an electric field may not occur, and the free carriers generated by the electron beam may be spontaneously recombined in the undoped AlGaN 36. Since the recombination is generated in the undoped AlGaN having a relatively large band gap, light having a wavelength shorter than a desired wavelength may be emitted.

For example, in a case in which the undoped AlGaN is $Al_{0.9}Ga_{0.1}N$, a light emission spectrum B having a peak wavelength of approximately 210 nm is illustrated as in FIG. 7. A peak intensity of light B generated due to the spontaneous recombination may be lower than the peak intensity of light A due to drift-recombination.

Figure 8:
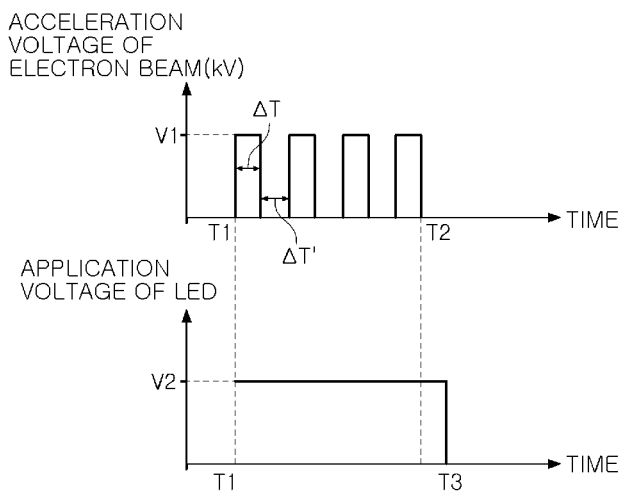
FIG. 8 is another example of time charts illustrating levels of voltage applied to an electron beam irradiation source and a semiconductor light emitting diode for driving an ultraviolet light emitting apparatus.

FIG. 8 is another example of time charts illustrating levels of voltage applied to an electron beam irradiation source and a semiconductor light emitting diode for driving an ultraviolet light emitting apparatus.

If carriers are generated once, since they are maintained during a lifetime, the electron beam irradiation source may be discontinuously driven, rather than being continuously driven. For example, as illustrated in FIG. 8, the electron beam irradiation source may be pulse-on/off or periodically on/off to discontinuously generate carriers. In example embodiments, a voltage may be simultaneously applied to the electron beam irradiation source and the semiconductor light emitting device. An application voltage for the electron beam irradiation source may be on during a first time ΔT and subsequently, may be off during a second time ΔT' and the on-off process may be repeatedly performed. The first time ΔT may be time for generating a sufficient amount of carriers within the undoped nitride semiconductor layer, and the second time ΔT' may be set to be shorter than a time for which carriers within the undoped nitride semiconductor layer are spontaneously recombined or consumed during the drifting thereof in consideration of the time. Even after a time T2 at which an on-operation of a final period is terminated, since carriers may remain within the undoped nitride semiconductor layer, the semiconductor light emitting device may be driven to a specific time T3 by the application of voltage.

Various forms of semiconductor light emitting devices may be applied to the ultraviolet light emitting apparatus according to example embodiments.

Figure 9:
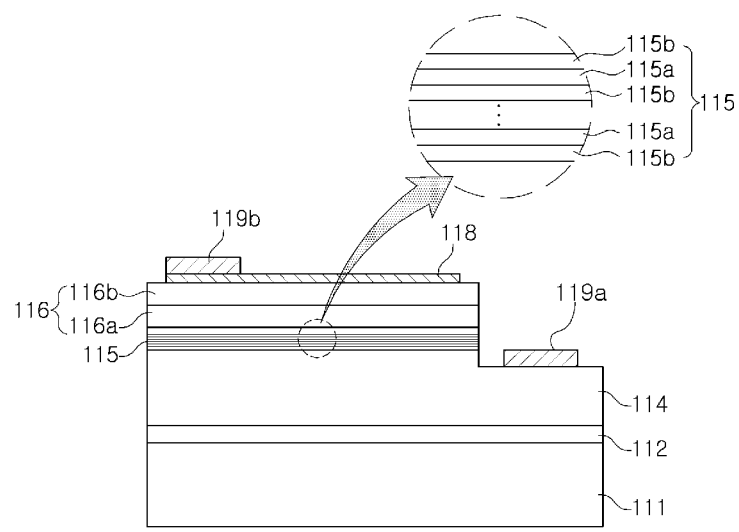
FIG. 9 is a side cross-sectional view illustrating an example of a semiconductor light emitting diode employable in the ultraviolet light emitting apparatus according to example embodiments of inventive concepts.
Figure 10:
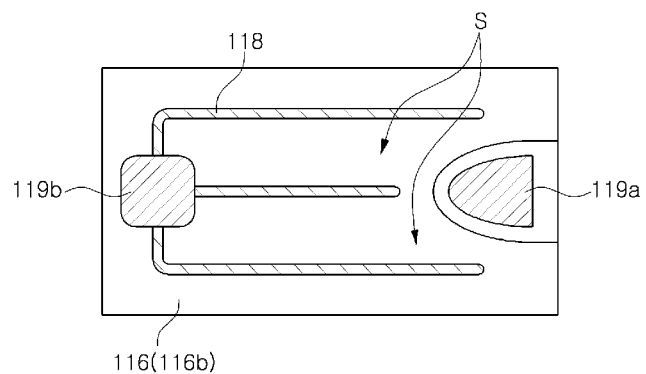
FIG. 10 is a plan view of the semiconductor light emitting diode illustrated in FIG. 9.

FIG. 9 is a side cross-sectional view illustrating an example of a semiconductor light emitting diode employable in the ultraviolet light emitting apparatus according to example embodiments of inventive concepts. FIG. 10 is a plan view of the semiconductor light emitting diode illustrated in FIG. 9.

A semiconductor light emitting device 110 illustrated in FIG. 9 may include a first conductivity type semiconductor layer 114, an active layer 115, and a pseudo-second conductivity type semiconductor layer 116 sequentially disposed on a substrate 111. A buffer layer 112 may be disposed between the substrate 111 and the first conductivity type semiconductor layer 114.

The buffer layer 112 may be formed of $Al_xGa_{1-x}N$ (0<x≤1). For example, the buffer layer 112 may be an AlN nucleus-growth layer. Depending on necessity, a plurality of layers may be combined or a composition may be gradually varied to be used.

The substrate 111 employed in example embodiments may be a light transmissive substrate such as sapphire. However, the light transmissive substrate is not limited thereto, and it may be a conductive substrate or a semiconductor substrate in addition to an insulating substrate, as long as it has light transmission properties.

The first conductivity type semiconductor layer 114 may be an n-type nitride semiconductor satisfying $Al_xIn_yGa_{(1-x-y)}N(0<x\leq1, 0\leq y<1)$, and an n-type impurity may be silicon Si. For example, the first conductivity type semiconductor layer 114 may be n-type AlGaN. The pseudo-second conductivity type semiconductor layer 116 employed in example embodiments may include an AlGaN electron blocking layer 116a and an AlGaN capping layer 116b. The AlGaN electron blocking layer 116a may be configured to have a relatively large band gap. The AlGaN electron blocking layer 116a may limit and/or prevent electrons from overflowing, whereby injection efficiency of holes may be significantly improved. The component "pseudo-second conductivity type semiconductor layer 116" used in the specification may be disposed to be opposite to the first conductivity type semiconductor layer based on the active layer, but may be a semiconductor layer undoped or less-doped with a second conductivity type impurity. The pseudo-second conductivity type semiconductor layer 116 may be a layer generating carriers by the irradiation of an electron beam.

The pseudo-second conductivity type semiconductor layer 116 may be an undoped or low concentration p-type nitride semiconductor satisfying $Al_xIn_yGa_{(1-x-y)}N(0<x\leq1, 0\leq y<1)$. The AlGaN capping layer 116b may have a band gap identical to or greater than that of a quantum barrier layer 115b, and the AlGaN electron blocking layer 116a may have a second band gap greater than the band gap of the AlGaN capping layer 116b. For example, an Al compositional ratio of the AlGaN electron blocking layer 116a may be greater than that of the AlGaN capping layer 116b and may be approximately 0.9 or greater. In the case of doping the pseudo-second conductivity type semiconductor layer 116 with a p-type impurity, the p-type impurity may be Mg. However, since carriers may be generated through the irradiation of an electron beam without a doping process, the pseudo-second conductivity type semiconductor layer 116 may be an undoped semiconductor layer. Alternatively, one of the capping layer 116b and the electron blocking layer 116a may be doped with a p-type impurity and the other of the capping layer 116b and the electron blocking layer 116a may be intentionally undoped.

In example embodiments, an electron beam may be irradiated not only onto the AlGaN capping layer 116b but may also be irradiated onto the AlGaN electron blocking layer 116a, whereby carriers may be generated within the layers.

The active layer 115 may be a multiple quantum well (MQW) structure in which a plurality of quantum well layers 115a and a plurality of quantum barrier layers 115b are alternately stacked. For example, the plurality of quantum well layers 115a may be nitride layers formed of $Al_{x1}Ga_{1-x1}N(0<x1<1)$, and the plurality of quantum barrier layers 115b may be nitride layers formed of $Al_{x2}Ga_{1-x2}N$ $(x1<x2<1)$.

The quantum well layers 115a employed in example embodiments may emit light having a wavelength of 210 to 315 nm. For example, x1 may be 0.2 to 0.95.

In example embodiments, portions of the pseudo-second conductivity type semiconductor layer 116 and the active layer 115 may be etched to expose an electrode formation region of the first conductivity type semiconductor layer 114. As illustrated in FIG. 10, a first bonding electrode 119a may be formed on the electrode formation region of the first conductivity type semiconductor layer 114, and other electrodes may be configured of three finger electrodes 118 disposed on the pseudo-second conductivity type semiconductor layer 116 and a second bonding electrode 119a connected thereto. As in example embodiments, the finger electrodes 118 may be formed on the pseudo-second conductivity type semiconductor layer 116 to promote uniform current dispersion in the overall area of the pseudo-second conductivity type semiconductor layer 116, while a considerable region S of the pseudo-second conductivity type semiconductor layer 116 may be exposed, whereby an electron beam may be effectively irradiated.

Figure 11:
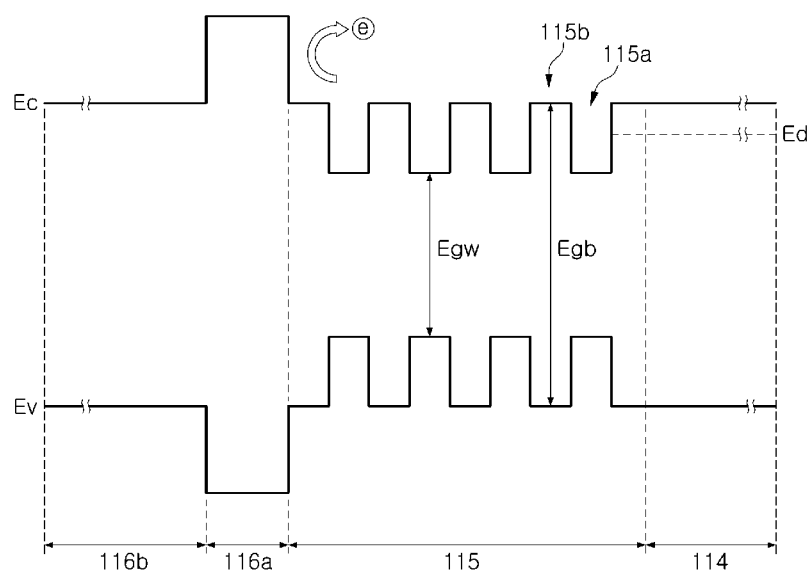
FIG. 11 is a band diagram of the semiconductor light emitting diode illustrated in FIG. 9.

FIG. 11 is a band diagram of the semiconductor light emitting diode illustrated in FIG. 9.

Referring to FIG. 11, a band diagram of the first conductivity type semiconductor layer 114 and the pseudo-second conductivity type semiconductor layer 116 centered on the active layer 115 is illustrated. The first conductivity type nitride semiconductor layer 114 may be n-type AlGaN. The first conductivity type nitride semiconductor layer 114 may have a donor level Ed due to the doping of an n-type impurity. The pseudo-second conductivity type semiconductor layer 116 may include the AlGaN capping layer 116b and the AlGaN electron blocking layer 116a having a band gap greater than that of the AlGaN capping layer 116b.

The active layer 115 employed in example embodiments may be a multiple quantum well structure formed of AlGaN/AlGaN. The AlGaN quantum well layer 115a may have a band gap Egw for desired ultraviolet light. The AlGaN quantum well layer 115a may be formed to emit light having a wavelength of 210 to 315 nm. The AlGaN quantum barrier layer 115b may have a band gap Egb greater than the band gap Egw of the quantum well layer 115a.

When an electron beam is irradiated on the pseudo-second conductivity type semiconductor layer 116, in particular, on the AlGaN capping layer 116b, free carriers may be generated. When a voltage is applied to the semiconductor light emitting device 110, only holes of the free carriers may be injected into the quantum well layer 115a and may be recombined with electrons injected from the first conductivity type nitride semiconductor layer 114 on the opposite side thereof, whereby light having an ultraviolet wavelength corresponding to the band gap of the quantum well layer 115a may be emitted.

Figure 12:
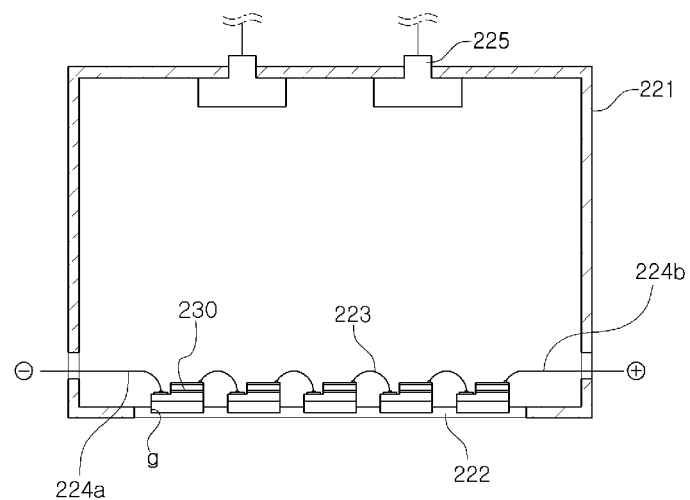
FIG. 12 is a schematic diagram illustrating an ultraviolet light emitting apparatus according to example embodiments of inventive concepts.
Figure 13:
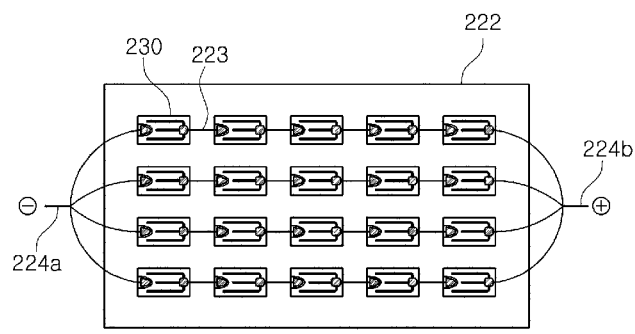
FIG. 13 is a plan view illustrating a semiconductor light emitting diode array employed in FIG. 12.

FIG. 12 is a schematic diagram illustrating an ultraviolet light emitting apparatus according to example embodiments of inventive concepts. FIG. 13 is a plan view illustrating a semiconductor light emitting diode array employed in FIG. 12.

An ultraviolet light emitting apparatus 200 illustrated in FIG. 12 may include a chamber 221 having an internal space and a plurality of electron beam irradiation sources 225 mounted in the internal space of the chamber 221.

The chamber 221 may include a light emission window 222 and a plurality of semiconductor light emitting devices 230 may be disposed on the light emission window 222. Each of the semiconductor light emitting devices 230 may include a first conductivity type nitride semiconductor layer, an undoped nitride semiconductor layer, and an active layer interposed between the first conductivity type nitride semiconductor layer and the undoped nitride semiconductor layer.

In example embodiments, the plurality of semiconductor light emitting devices 230 are arranged. Two or more electron beam irradiation sources 225 may be included in order to irradiate an electron beam on an array region of the plurality of semiconductor light emitting devices 230. The plurality of semiconductor light emitting devices 230 may be electrically connected to each other. The connection may be implemented using connection lines 223 and as illustrated in FIG. 13, the plurality of semiconductor light emitting devices 230 may be connected to each other in series through four connection lines and may be connected to each other in parallel through 4 connection lines, thereby being simultaneously driven.

The semiconductor light emitting devices 230 may be disposed toward the light emission window 222. The semiconductor light emitting devices 230 may be adhered to a surface of the light emission window 222 using an UV curing resin but as in example embodiments, the semiconductor light emitting devices 230 may be adhered to the surface of the light emission window 222 through grooves g formed in the light emission window 222. A region of the light emission window 222 on which the semiconductor light emitting devices are not disposed may be coated with an electron beam blocking layer such that an electron beam does not penetrate through the light emission window 222.

In each of the semiconductor light emitting devices 230, an undoped nitride semiconductor layer 236 may be disposed toward the electron beam irradiation sources 225. The ultraviolet light emitting apparatus 200 may further include first and second connection electrodes 224a and 224b connected to both terminals of the semiconductor light emitting device array, respectively, in order to connect an external power source to the semiconductor light emitting devices 230. The first and second connection electrodes 224a and 224b may be connected to the semiconductor light emitting devices 230 and be drawn outwardly from the chamber 221.

As set forth above, according to example embodiments of inventive concepts, an ultraviolet light emitting apparatus capable of emitting ultraviolet light at external quantum efficiency by applying a voltage to the semiconductor light emitting device to be driven in a state in which free carriers at a high concentration are generated by irradiating an electron beam onto a capping layer of the semiconductor light emitting device may be provided. The capping layer may be an undoped semiconductor layer in which a p-type impurity is not intentionally doped.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments.

While some example embodiments have been particularly shown and described, it will be understood by one of ordinary skill in the art that variations in form and detail may be made therein without departing from the spirit and scope of the claims.

What is claimed is:

1. An ultraviolet light emitting apparatus comprising:
a chamber including a light emission window, the chamber defining an internal space;
a semiconductor light emitting device on the light emission window, the semiconductor light emitting device including,
a first conductivity type nitride semiconductor layer,
an undoped nitride semiconductor layer, and
an active layer between the first conductivity type nitride semiconductor layer and the undoped nitride semiconductor layer;
an electron beam irradiation source in the internal space of the chamber, the electron beam irradiation source being configured to irradiate an electron beam onto the undoped nitride semiconductor layer; and
first and second connection electrodes configured to apply a voltage from an external power source to the semiconductor light emitting device.

2. The ultraviolet light emitting apparatus of claim 1, wherein the active layer has a single quantum well layer including $Al_xGa_{1-x}N(0<x<1)$.

3. The ultraviolet light emitting apparatus of claim 1, wherein
the active layer includes a plurality of quantum well layers and a plurality of quantum barrier layers alternately stacked on each other,
each of the quantum well layers includes $Al_{x1}Ga_{1-x1}N$ $(0<x1<1,)$ and
each of the quantum barrier layers includes $Al_{x2}Ga_{1-x2}N$ $(x1<x2<1)$.

4. The ultraviolet light emitting apparatus of claim 1, wherein the active layer is configured to emit light having a wavelength of 210 to 315 nm.

5. The ultraviolet light emitting apparatus of claim 1, wherein the active layer is doped with a first conductivity type impurity.

6. The ultraviolet light emitting apparatus of claim 1, wherein the undoped nitride semiconductor layer includes $Al_xIn_yGa_{(1-x-y)}N(0<x\leq1, 0\leq y<1)$.

7. The ultraviolet light emitting apparatus of claim 1, wherein the first conductivity type nitride semiconductor layer faces the light emission window.

8. The ultraviolet light emitting apparatus of claim 1, wherein the first conductivity type nitride semiconductor layer includes an n-type nitride semiconductor layer that includes $Al_xIn_yGa_{(1-x-y)}N(0<x\leq1, 0\leq y<1)$.

9. The ultraviolet light emitting apparatus of claim 1, wherein the undoped nitride semiconductor layer has a thickness of 50 nm to 1 μm.

10. The ultraviolet light emitting apparatus of claim 1, wherein the semiconductor light emitting device further includes:
a first electrode connected to the first conductivity type nitride semiconductor layer; and
a second electrode on the undoped nitride semiconductor layer.

11. The ultraviolet light emitting apparatus of claim 10, wherein the second electrode has a thickness of 20 nm to 100 nm.

12. The ultraviolet light emitting apparatus of claim 10, wherein the second electrode includes:
a bonding electrode on a region of an upper surface of the undoped nitride semiconductor layer; and
at least one finger electrode extended from the bonding electrode.

13. The ultraviolet light emitting apparatus of claim 1, further comprising:
a plurality of semiconductor light emitting devices electrically connected to each other, wherein
the plurality of semiconductor light emitting devices include the semiconductor light emitting device.

14. The ultraviolet light emitting apparatus of claim 1, wherein the electron beam irradiation source is configured to emit an electron beam of 5 to 50 KV.

15. An ultraviolet light emitting apparatus comprising:
a chamber including a light emission window, the chamber defining an internal space;
a semiconductor light emitting device on the light emission window, the semiconductor light emitting device including,
a first conductivity type semiconductor layer, a capping layer including at least one of an undoped semiconductor and a second conductivity type semiconductor, and an active layer between the first conductivity type semiconductor layer and the capping layer;

an electron beam irradiation source in the internal space of the chamber, the electron beam irradiation source being configured to irradiate an electron beam onto the capping layer;

first and second connection electrodes connected to the semiconductor light emitting device and drawn outwardly from the chamber;

a first driving unit configured to drive the electron beam irradiation source;

a second driving unit configured to drive the semiconductor light emitting device through the first and second connection electrodes; and a driving controller configured to control the first and second driving units.

16. A light emitting apparatus comprising:

a semiconductor light emitting device including a plurality of nitride semiconductor layers, the plurality of nitride semiconductor layers including a capping layer contacting an active layer, the capping layer including at least one of p-type nitride semiconductor layer and an undoped nitride semiconductor layer; and an electron beam irradiation source configured to irradiate an electron beam onto the capping layer; and first and second electrodes configured to apply a voltage to the semiconductor light emitting device, the active layer being configured to emit light in response to the voltage applied to the semiconductor light emitting device by the first and second electrodes.

17. The light emitting apparatus of claim 16, further comprising:

a first driving unit configured to drive the electron beam irradiation source;

a second driving unit configured to drive the semiconductor light emitting device through the first and second electrodes; and a driving controller configured to control the first and second driving units.

18. The light emitting apparatus of claim 16, wherein the plurality of nitride semiconductor layers include an n-type nitride semiconductor layer, the active layer is between the n-type nitride semiconductor layer and the capping layer, the active layer includes at least one quantum well layer including AlGaN, the capping layer includes $Al_xIn_yGa_{(1-x-y)}N (0<x\leq1, 0\leq y<1)$, and the n-type nitride semiconductor layer includes $Al_xIn_yGa_{(1-x-y)}N (0<x\leq1, 0\leq y<1)$.

19. The light emitting apparatus of claim 16, further comprising:

a chamber including a light emission window, wherein the chamber defines an internal space, the semiconductor light emitting device is in the chamber, and the semiconductor light emitting device faces the light emission window.

20. The light emitting apparatus of claim 16, further comprising:

a plurality of semiconductor light emitting devices electrically connected to each other, wherein the plurality of semiconductor light emitting devices include the semiconductor light emitting device.

* * * * *